TRANSISTOR MICROWAVE GENERATOR WITH SECOND HARMONIC OUTPUT
Filed Aug. 8, 1967
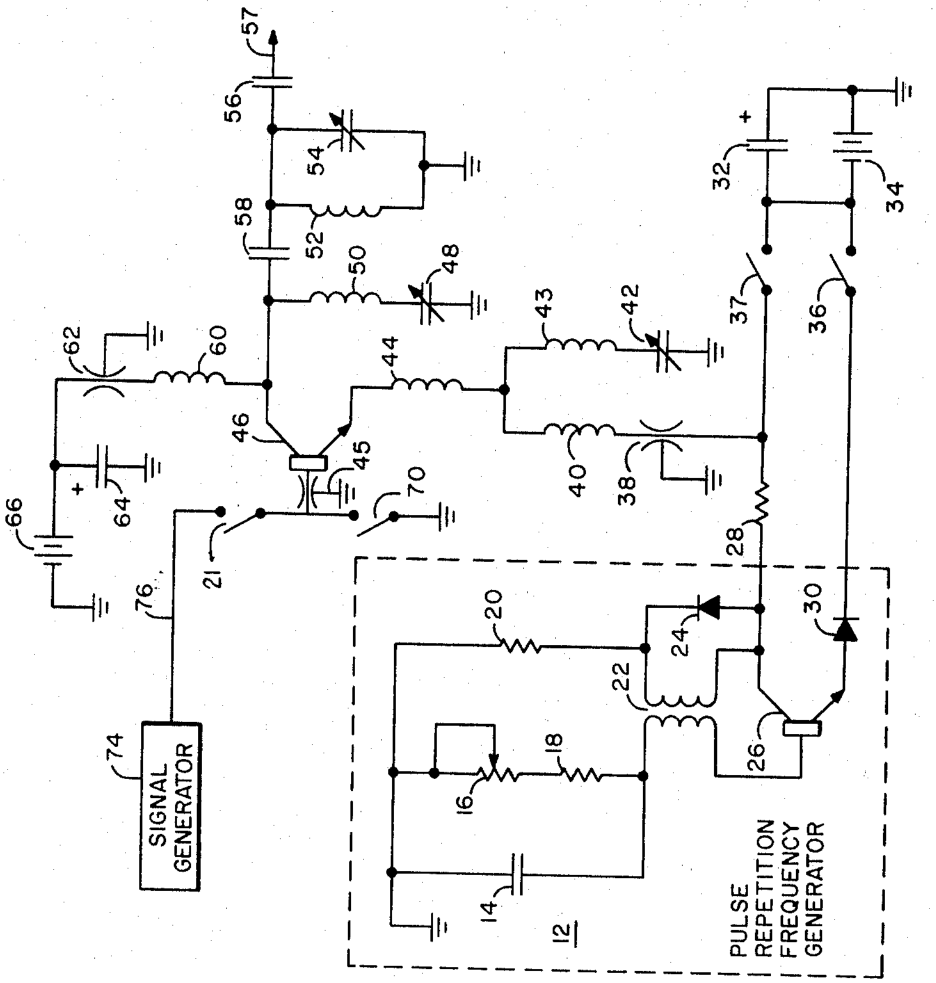
INVENTORS
CURTISS C. KRUEGER
RONALD C. WORLEY
BY Carl R. Brown
Attorney United States Patent Office 3,439,287

Patented Apr. 15, 1969

3,439,287

TRANSISTOR MICROWAVE GENERATOR WITH SECOND HARMONIC OUTPUT

Curtiss C. Krueger and Ronald C. Worley, San Diego, Calif., assignors to Ryan Aeronautical Co., San Diego, Calif.

Filed Aug. 8, 1967, Ser. No. 659,065
Int. Cl. H03b 5/24
U.S. Cl. 331—47 9 Claims

ABSTRACT OF THE DISCLOSURE

An S-Band microwave generator utilizing an RF power transistor in a grounded-base oscillator circuit. An idler circuit at the collector of the transistor determines the oscillator frequency, and a tank circuit at the collector provides the second harmonic output frequency while helping to reject from the output all other generated frequencies. A pulse generator pulses the D.C. supply voltage for the power transistor to provide a pulsed microwave output signal.

*Background of the invention*

There is a particular need for a small, hand-held, self-contained S-Band source of microwave signals that may be used with a small antenna, such as a circularly polarized helical antenna, to be used as a beacon, for instantaneous go/no-go testing of S-Band gear or for other suitable uses. However, the device requires a circuit for generating microwave signals in and around the S-Band region that is small in size, has low power consumption, and that is relatively inexpensive to make.

There are many circuits and devices for generating microwave signals in and around the S-Band region. However these circuits and devices generally comprise long chains of multipliers with their resulting complexity, alignment difficulties, and poor efficiency due to the multiplicity of stages. Additionally these devices usually require lower frequency power supplies and then use classical techniques to double, triple, and quadruple the resulting frequencies to the microwave region further complicating the circuitry.

There is also a need for such a circuit that also has the capability of providing FM modulation to the S-Band microwave signals generated.

It is therefore advantageous to have a relatively simple, small in size, circuit having low power consumption that is capable of providing microwave signal output that is continuous wave, pulsed or keyed, or that has frequency modulation.

*Summary of the invention*

The embodiment of the circuit for generating microwave signals of our invention permits the generation of a substantial amount of RF power at S-Band utilizing a standard, low-cost, RF power transistor. A grounded-base oscillator circuit configuration generates an RF carrier frequency equal to one half the output frequency. An idler circuit at the collector terminal of the power transistor determines the oscillator frequency. A variable capacitor connected to the emitter load of the power transistor tunes out the lead inductance and stray capacitance. Proper adjustment of this capacitor minimizes losses that would otherwise exist in the emitter circuit and therefore optimizes the efficiency of the oscillator circuit.

An adjustable output tank circuit supports the second harmonic of the oscillator frequency and helps to reject all other generated frequencies. A strong second harmonic energy exists in the oscillator circuit due to the varactor reaction of the collector-to-base capacitance hanging in a square-law fashion with instantaneous collector voltage. Thus the useful frequency range has been effectively doubled, with little loss in efficiency, by taking advantage of this transistor characteristic.

A pulse repetition frequency generator pulses a direct current voltage to the power transistor and thus provides a predetermined pulse at signal output at the microwave frequency. A signal generator may also be coupled with the base of the power transistor and by selectively varying the base voltage to the power transistor, causes the frequency output of the oscillator to vary providing frequency modulation of the microwave signals generated.

Thus we have provided a simplified circuit that has low power requirements, is inexpensive to build, is capable of providing microwave signal output in and around the S-Band region and which microwave outputs can be CW, pulse modulated or FM.

It is therefore an object of our invention to provide a new and improved circuit for the generation of microwave signals.

It is another object of our invention to provide a new and improved circuit for the generation of microwave signals in and around the S-Band region.

It is another object of our invention to provide a new and improved circuit for the generation of microwave signals in and around the S-Band region that is small in size, has low power consumption, has a relatively simplified circuit, and the output from which may be modulated.

Other objects and advantages of our invention will become more apparent upon a reading of the following detailed description and a reference to the drawing in which like parts are designated by like reference numerals.

Referring now to the drawing, batteries 34 and 66 provide direct current power for the circuit. Capacitors 32 and 64 function as simplified DC voltage regulators and store power to be supplied when the batteries cannot because of an excessive power draw. Switches 36 and 37 are closed at intervals in the operation of the circuit to provide different modes of operation. For example, and as will become more clear hereinafter, switch 36 is closed and switch 37 is open during the time the circuit provides a given frequency output that is pulsed by the pulse repetition frequency generator 12. When it is desired that the circuit provide a continuous microwave output or a frequency modulated output, then switch 36 is open and switch 37 is closed.

The pulse repetition frequency generator 12 provides a pulsing DC voltage to the oscillator by interrupting the battery voltage going to the oscillator. Thus its function is somewhat similar to a blocking oscillator circuit. The transistor 26 switches the DC voltage to the oscillator circuit on and off with the pulse width of the output being set by the parameters of the transformer 22. The duty cycle is controlled by the setting of potentiometer 16 that may be selectively varied. Diode 24 acts as a clamp to protect the transistor 26 from kick-back voltage generated by the transformer 22 and diode 30 protects the emitter-base of the transistor 26 from breakdown voltages. The resistor 20 is a current limiting resistor to protect the transistor 26 and resistor 28 is a current limiting resistor that sets the power output of the microwave oscillator.

The transistor 26 is initially on which switch 36 is closed and stays on in a short circuit, conductive condition for a period set by the time constant characteristics of the transformer 22. The off-time of the transistor 26 is determined by the relationship of the resistors 18, adjustable potentiometer 16, and capacitor 14.

The output from the pulse repetition frequency generator 12 is supplied to capacitor 38 that functions as an RF by-pass capacitor that allows direct current to pass but effectively stops RF signals that might otherwise pass back into the pulse repetition frequency generator circuit 12. Inductance 40 functions as an RF choke and also presents a high impedance to RF energy flowing backward into the circuit 12. By-pass capacitor 45 stops RF signals from passing in the line connecting switches 22 and 70.

When switch 70 is closed, such as during the pulse output mode or in the CW mode, power transistor 46 is energized providing an output that with the circuit parameters as will be described in more detail hereinafter, provides an RF carrier frequency, the second harmonic of which provides a frequency output $f1$ to line 57 that is in or around the S-Band region. The inductor 50 and the variable capacitor 48 form an idler circuit means that is tuned to the carrier frequency $f_0$. The circuit comprising inductor 43 and variable capacitor 42 are also tuned to the frequency $f_0$. The circuit comprising inductor 52 and variable capacitor 54 in parallel, is tuned to the output frequency $f1$ that is supplied through line 57 to the output.

Inductor 60 and by-pass capacitor 62 allow DC current to flow therethrough from battery supply 66 while functioning as chokes to restrict backward RF frequency flow by presenting a high impedance. Capacitor 58 functions to couple the RF output from the oscillator circuit to the tank circuit formed by inductor 52 and variable capacitor 54. Capacitor 56 couples the RF output of the tank circuit 52 and 54 to the load or antenna.

In operation of the circuit, the transistor 46, inductor 44, inductor 50 and variable capacitor 48 form an oscillator and the parameters of inductors 43, 50 and 52 and the variable capacitors 42, 48 and 54 set the frequency of the oscillator output. The internal collector to base capacitance $Ccb$ and the base to emitter capacitance $Cbe$ of transistor 46 provides the feedback for oscillation in the oscillator circuit.

The capacitance $Ccb$ varies with voltage output, which is a characteristic of the transistor 46 and takes the form of varactor reaction. In the frequency output, the varying voltage provides a harmonic output with the second harmonic being the frequency $f1$. Since the circuit formed by inductor 43 and variable capacitor 42 is tuned to the carrier frequency $f_0$ or one-half $f1$, and the second harmonic is $f1$, this circuit opposes the frequency and tunes out the lead inductance and stray capacitance in the emitter load. The circuit formed by inductor 52 and variable capacitor 54 is adjusted to select the particular frequency output $f1$ and directs it through the coupling capacitor 56 to the antenna or load.

It should be understood that when the oscillator is oscillating, then the collector voltage is varying and can vary in frequency of, for example, one cycle in a variation of zero to 44 volts, which is essentially twice the voltage of the supply voltage. Thus the circuit has considerable stability and provides state-of-the-art performance by a simple circuit.

*Pulsing microwave output mode*

In operation, switches 36 and 70 are closed supplying DC voltage from battery 34 to the pulse repetition frequency generator 12. Transistor 26 is energized and thus forms a relatively low resistance path for the DC voltage through resistor 28 to the power transistor 46 that oscillates in the manner previously described to provide a given frequency output $f0$ having strong second harmonic energy that is supplied to output line 57. The pulse repetition frequency generator 12 functions in the manner previously described to interrupt this DC voltage and thus interrupt the operation of the oscillator and provide the pulsed microwave output.

*CW microwave output mode*

In continuous wave operation, switch 36 is open and switch 37 is closed and switch 70 is closed. This supplies a continuous DC voltage to the power transistor 46 that provides a continuous frequency output to output line 57.

*FM microwave output mode*

In operation of the frequency modulation mode, switch 36 is open and switch 37 is closed, switch 70 is open and switch 21 is closed. A signal generator 74 provides a varying voltage output through line 76 to the base of power transistor 46 that may comprise an audio signal or any other type of desired signal to be transmitted from one point to another point. The RF output in the CW mode is constant when the supply voltages from the DC power supply 34 are held substantially constant. Accordingly in the CW mode, the average value of the capacitance $Ccb$ is constant. When the voltage between the collector and base is varied, then this varies the average value of the capacitance $Ccb$ causing a change in the frequency of the RF output in line 56. Thus the signal generator 74 provides a predetermined small percentage of voltage changes to the base of transistor 46 that provides a small percentage of predictable frequency change in the RF or microwave output, which over a portion of the range of voltage change is substantially linear.

The center of the voltage output of the signal generator 74 is at zero and the center frequency of the RF output corresponds to a zero voltage from the signal generator 74. As the voltages vary above or below the zero potential, then the frequency is increased when the voltages are in the negative direction and is decreased when the voltages are in the positive direction. The other tuning circuits in this mode have a sufficiently wide band of acceptance that the frequency output may be varied within the ranges desired.

In further operation, the capacitor 48 is adjusted to provide the operating frequency, the emitter tuning capacitor 42 is tuned to frequency $f_0$ and capacitor 54 is tuned to provide maximum output.

While we have shown and described a specific form of our invention, it is to be understood that various changes and modifications may be made without departing from the spirit of the invention as set forth in the appended claims.

Having described our invention, we now claim:

1. A direct current operated circuit for the generator of microwave signals comprising:

voltage supply means for providing direct current voltage output, a transistor oscillator means having a transistor with a collector, emitter and base for generating a given RF carrier frequency, said emitter being electrically connected to said voltage supply means and said base being connected to ground, idler circuit means connected to the collector of said transistor for setting said given carried frequency, adjustable output tank circuit means electrically connected to said collector for supporting the second harmonic of said given frequency and rejecting all other generator frequencies, and pulse repetition frequency generator means connected between said direct current voltage output and said transistor oscillator means for pulsing said direct current voltage to said transistor oscillator means.

2. A direct current operated circuit for the generation of microwave signals according to claim 1 in which:

said idler circuit means comprising an inductor and variable capacitor connected in series between said collector and ground.

3. A direct current operated circuit for the generation of microwave signals according to claim 1 in which:

said pulse repetition frequency generator means being powered solely by said direct current voltage output.

4. A direct current operated circuit for the generation of microwave signals according to claim 3 in which:
said pulse repetition frequency generator means comprises a switching transistor connected emitter and collector in series between said voltage supply means and said transistor oscillator means,
and transformer means connected across the base and collector of said switching transistor for energizing and de-energizing said transistor with a repetitive time constant.

5. A direct current operated circuit for the generation of microwave signals according to claim 4 including:
inductor and variable capacitor means connected in series between the emitter load of said transistor oscillator means and ground and tuned to said carrier frequency.

6. A direct current operated circuit for the generation of microwave signals according to claim 5 including:
a second voltage supply for providing a direct current voltage to the collector circuit of said transistor oscillator means.

7. A direct current operated circuit for the generation of microwave signals according to claim 6 including:
at least one RF by-pass capacitor being connected between said voltage supply means and said transistor oscillator means and said second voltage supply means and said transistor oscillator means.

8. A direct current operated circuit for the generation of microwave signals comprising:
voltage supply means for providing direct current voltage output,
a transistor oscillator means having a transistor with a collector, emitter and base, for generating a given RF carrier frequency,
said emitter being electrically connected to said voltage supply means and said base being selectively electrically connected to said voltage supply means and said base being selectively electrically connected to ground,
idler circuit means connected to the collector of said transistor for setting said given carrier frequency,
adjustable output tank circuit means electrically connected to said collector for supporting the second harmonic of said given frequency and rejecting all other generated frequencies,
and inductor and variable capacitor means connected in series between said emitter and ground and tuned to said carrier frequency.

9. A direct current operated circuit for the generation of microwave signals according to claim 8 including:
signal generator means for providing a selectively varying voltage around ground potential to the base of said transistor.

References Cited

UNITED STATES PATENTS

| | | | |
|---|---|---|---|
| 2,824,964 | 2/1958 | Yin | 331—117 X |
| 3,108,234 | 10/1963 | Burns | 331—117 X |

OTHER REFERENCES

Lee: "Microwave Power Generation Using Overlay Transistors," RCA Review, June 1966, pp. 213–215.

ROY LAKE, *Primary Examiner.*

S. H. GRIMM, *Assistant Examiner.*

U.S. Cl. X.R.

331—71, 77, 106, 112, 117, 173, 185; 332—9, 16